(12) United States Patent
Gai et al.

(10) Patent No.: US 9,831,277 B2
(45) Date of Patent: Nov. 28, 2017

(54) ARRAY SUBSTRATE HAVING AN ELECTRO-STATIC DISCHARGE UNIT, ELECTRO-STATIC DISCHARGE METHOD THEREOF AND DISPLAY DEVICE

(71) Applicant: BOE TECHNOLOGY GROUP CO., LTD., Beijing (CN)

(72) Inventors: Cuili Gai, Beijing (CN); Quanhu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/222,136

(22) Filed: Jul. 28, 2016

(65) Prior Publication Data
US 2017/0110478 A1 Apr. 20, 2017

(30) Foreign Application Priority Data
Oct. 16, 2015 (CN) .......................... 2015 1 0673778

(51) Int. Cl.
*H01L 27/12* (2006.01)
*H01L 27/02* (2006.01)

(52) U.S. Cl.
CPC ........ *H01L 27/124* (2013.01); *H01L 27/0266* (2013.01)

(58) Field of Classification Search
CPC .......................... H01L 27/124; H01L 27/0266
See application file for complete search history.

(56) References Cited

U.S. PATENT DOCUMENTS

| | | | | |
|---|---|---|---|---|
| 2004/0252117 A1* | 12/2004 | Tanada | ..................... | G09G 3/32 345/212 |
| 2009/0289888 A1* | 11/2009 | Aoki | .................... | G09G 3/3688 345/100 |
| 2013/0215092 A1* | 8/2013 | Wu | ....................... | G09G 3/3225 345/206 |
| 2016/0163264 A1* | 6/2016 | Nishimura | .......... | G09G 3/3258 345/212 |
| 2017/0032738 A1* | 2/2017 | Lee | ...................... | G09G 3/3233 |

* cited by examiner

Primary Examiner — Bilkis Jahan
(74) Attorney, Agent, or Firm — Ladas & Parry LLP

(57) ABSTRACT

An array substrate, an electro-static discharge method thereof and a display device are disclosed. The array substrate includes: a plurality of data lines, a plurality of gate lines, a power signal line, a charge release signal line, a plurality of electro-static discharge units and at least one short circuit ring unit. The charge release signal line and the power signal line are disposed in parallel, two electro-static discharge units are disposed between them to form an electro-static discharge circuit, each gate line and/or each data line is connected with the charge release signal line by one electro-static discharge unit; the short circuit ring unit is connected between the charge release signal line and the power signal line.

9 Claims, 6 Drawing Sheets

ARRAY SUBSTRATE HAVING AN ELECTRO-STATIC DISCHARGE UNIT, ELECTRO-STATIC DISCHARGE METHOD THEREOF AND DISPLAY DEVICE

TECHNICAL FIELD

Embodiments of the present disclosure pertain to an array substrate, an electro-static discharge method thereof and a display device.

BACKGROUND

It is known that flat panel displays have advantages such as low power consumption, small size, small weight, ultra thin screen and the like, compared with other kinds of displays, and are recently widely applied to, for example, intelligent devices, instruments, and low power consumption electronic products, which are controlled by single chip microcomputers or other controlling devices.

Generally, display panels mainly comprise two types: liquid crystal display panels and organic electroluminescent display panels. As a core component of a display panel, the performance of an array substrate is especially important. However, conventional array substrates have poor ability of resisting electro-static damages, and electro-static damages often occur, which results in a short circuit between lines on the panel. Especially for an organic electroluminescent display panel, in the process of fabricating the array substrate thereof, a lot of electro-static discharges may occur in the process of cathode deposition. The electro-static discharges may seriously damage the array substrate, and the product yield is decreased.

SUMMARY

An embodiment of the present disclosure provides an array substrate, comprising: a plurality of data lines, a plurality of gate lines, a power signal line, a charge release signal line, a plurality of electro-static discharge units and at least one short circuit ring unit, wherein, the charge release signal line and the power signal line are disposed in parallel, two electro-static discharge units are disposed between the charge release signal line and the power signal line to form an electro-static discharge circuit, each gate line and/or each data line is connected with the charge release signal line by one electro-static discharge unit; a first control terminal and a first input terminal of the short circuit ring unit are connected with the charge release signal line, a first output terminal is connected with the power signal line, a second control terminal and a second input terminal are connected with the power signal line, and a second output terminal is connected with the charge release signal line.

For example, two adjacent gate lines and/or two adjacent data lines correspond to one short circuit ring unit.

For example, the short circuit ring unit comprises: a first switching transistor and a second switching transistor; a gate electrode and a source electrode of the first switching transistor are both connected with the charge release signal line, and a drain electrode of the first switching transistor is connected with the power signal line; a gate electrode and a source electrode of the second switching transistor are both connected with the power signal line, and a drain electrode of the first switching transistor is connected with the charge release signal line.

For example, at least one of the electro-static discharge units comprises: a third switching transistor and a fourth switching transistor. The electro-static discharge unit, the power signal line and the charge release signal line constitute an electro-static discharge circuit, the gate electrode and the source electrode of the third switching transistor are both connected with the power signal line, and the drain electrode of the third switching transistor is connected with the charge release signal line; the gate electrode and the source electrode of the fourth switching transistor are both connected with the charge release signal line, and the drain electrode of the fourth switching transistor is connected with the power signal line. Or the electro-static discharge unit connects the gate line and the charge release signal line, the gate electrode and the source electrode of the third switching transistor are both connected with the gate line, and the drain electrode of the third switching transistor is connected with the charge release signal line; the gate electrode and the source electrode of the fourth switching transistor are both connected with the charge release signal line, and the drain electrode of the fourth switching transistor is connected with the gate line. Or the electro-static discharge unit connects the data line and the charge release signal line, the gate electrode and the source electrode of the third switching transistor are both connected with the data line, and the drain electrode of the third switching transistor is connected with the charge release signal line; the gate electrode and the source electrode of the fourth switching transistor are both connected with the charge release signal line, and the drain electrode of the fourth switching transistor is connected with the data line.

For example, at least one of the electro-static discharge units comprises: a fifth switching transistor, a first capacitor and a second capacitor. The electro-static discharge unit, the power signal line and the charge release signal line constitute an electro-static discharge circuit, the gate electrode of the fifth switching transistor connects with one end of the first capacitor and one end of the second capacitor respectively, the source electrode of the fifth switching transistor connects with the other end of the first capacitor and the power signal line respectively, and the drain electrode of the fifth switching transistor connects with the other end of the second capacitor and the charge release signal line respectively. Or the electro-static discharge unit connects the gate line and the charge release signal line, the gate electrode of the fifth switching transistor connects with one end of the first capacitor and one end of the second capacitor respectively, the source electrode of the fifth switching transistor connects with the other end of the first capacitor and the gate line, and the drain electrode of the fifth switching transistor connects with the other end of the second capacitor and the charge release signal line. Or the electro-static discharge unit connects the data line and the charge release signal line, the gate electrode of the fifth switching transistor connects with one end of the first capacitor and one end of the second capacitor respectively, the source electrode of the fifth switching transistor connects with the other end of the first capacitor and the data line respectively, the drain electrode of the fifth switching transistor connects with the other end of the second capacitor and the charge release signal line respectively.

For example, the array substrate further comprises an organic electroluminescent structure comprising a cathode; the power signal line and the cathode of the organic electroluminescent structure are connected.

An embodiment of the present disclosure provides an electro-static discharge method of the array substrate mentioned above according to an embodiment of the present disclosure, comprising: upon static charges being generated on the power signal line, releasing the static charges to the electro-static discharge circuit through the short circuit ring unit; upon static charges being generated on the gate line or the data line, releasing the static charges to the charge release signal line through the electro-static discharge unit connected with the gate line or the data line, and releasing the static charges to the power signal line through the short circuit ring unit adjacent to the gate line or the data line.

An embodiment of the present disclosure provides an organic electroluminescent display panel, comprising the array substrate mentioned above according to an embodiment of the present disclosure.

An embodiment of the present disclosure provides a display device, comprising the organic electroluminescent display panel mentioned above according to an embodiment of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

In order to avoid the damage to an array substrate caused by the electro-static discharge, usually an electro-static discharge circuit is provided on the array substrate to release the static charges. However, the electro-static discharge path is long, which results in that the electro-static discharge is not timely, and other lines on the substrate are prone to be damaged, thus lot of uncontrollable display defects are generated, and the product yield is decreased. Therefore, how to improve the poor ability of resisting static damages and resolve the problem of the long path of the electro-static discharge of the array substrate is before those skilled in the art.

The array substrate, the electro-static discharge method thereof, and the display device according to embodiments of the present disclosure will be described in combination with the drawings in details as follows.

Figure 1A:
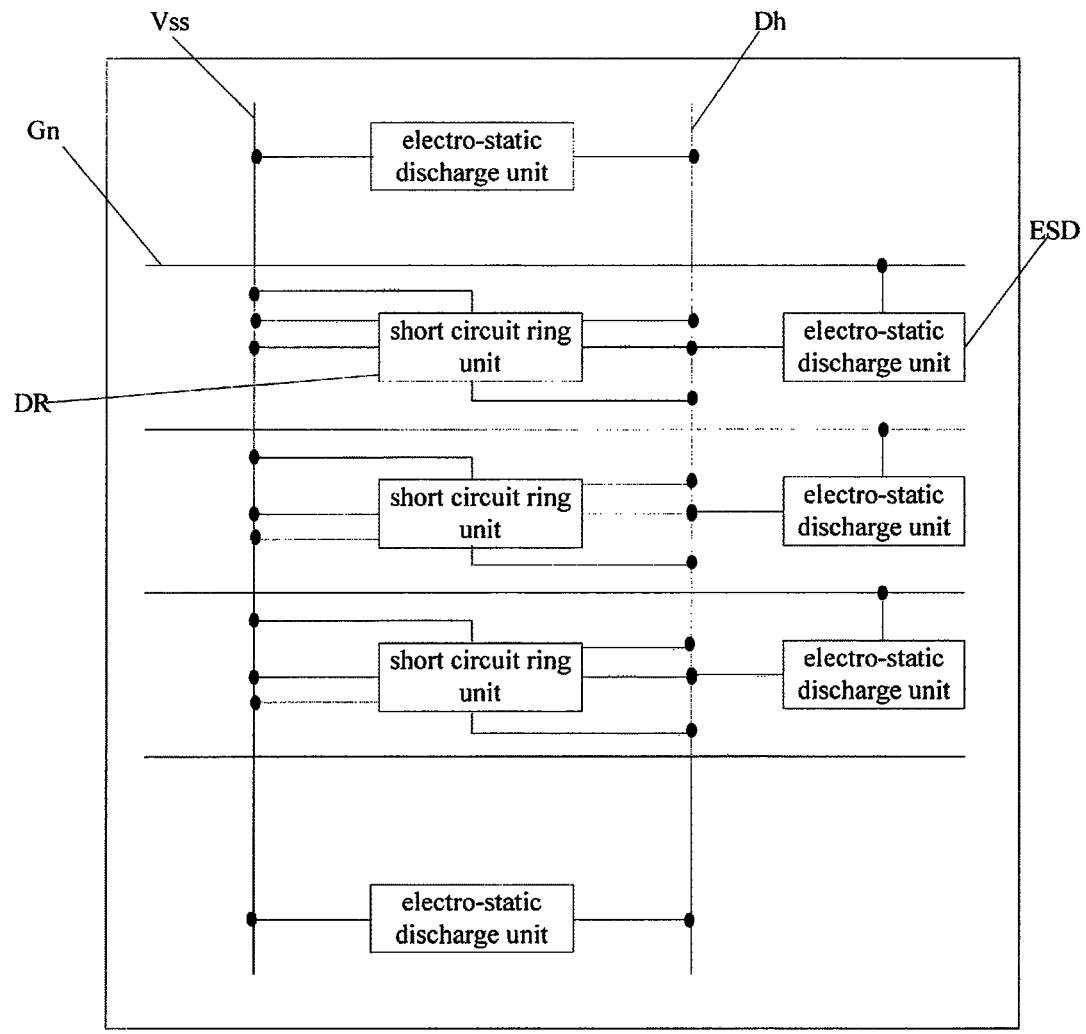
FIG. 1a and FIG. 1b are structure schematic views of an array substrate according to an embodiment of the present disclosure.
Figure 1B:
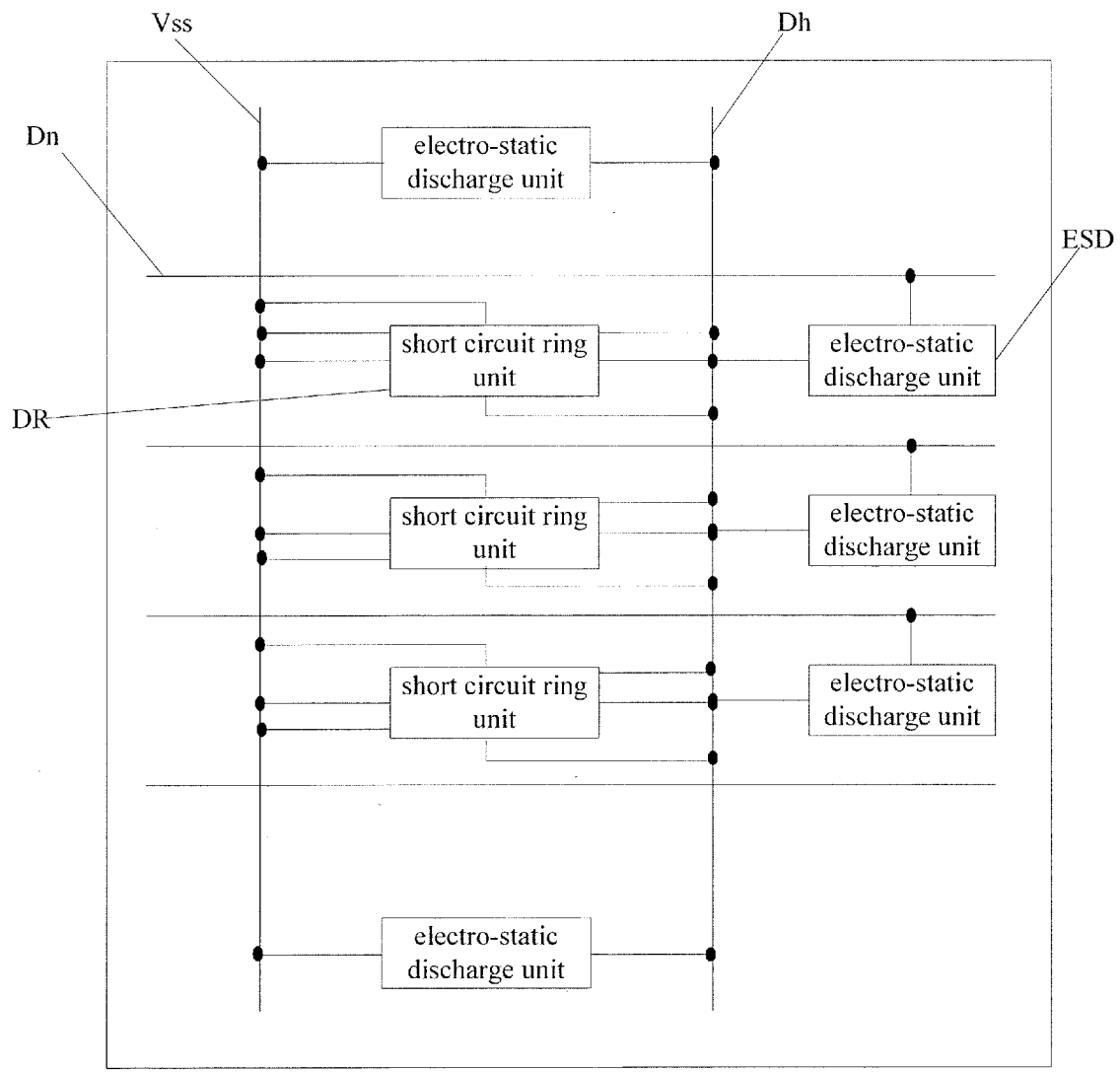

An embodiment of the present disclosure provides an array substrate, as shown in FIG. 1a and FIG. 1b (FIG. 1a shows that short circuit ring units are disposed between adjacent gate lines, and FIG. 1b shows that short circuit ring units are disposed between adjacent data lines), the array substrate comprises: a plurality of data lines Dn, a plurality of gate lines Gn, a power signal line Vss, a charge release signal line Dh, and a plurality of electro-static discharge units ESD. The charge release signal line Dh and the power signal line Vss are disposed in parallel, and two electro-static discharge units ESD are disposed between the charge release signal line Dh and the power signal line Vss to form an electro-static discharge circuit. Each gate line Gn and/or each data line Dn is connected to the charge release signal line Dh by one electro-static discharge unit ESD. The array substrate further comprises: at least one short circuit ring unit DR. The short circuit ring unit is connected between the charge release signal line Dh and the power signal line Vss.

In an example, a first control terminal and a first input terminal of the short circuit ring unit DR are connected with the charge release signal line Dh; a first output terminal is connected with the power signal line Vss; a second control terminal and a second input terminal are connected with the power signal line Vss; and a second output terminal is connected with the charge release signal line Dh.

In the array substrate mentioned above according to the embodiment of the present disclosure, the short circuit ring unit is added. In the fabricating process of the array substrate, because the deposited cathode is connected with the power signal line of the electro-static discharge circuit, when lot of static charges are generated on the deposited cathode during deposition, lot of static charges are generated on the power signal line as well. The static charges on the power signal line can be released to the electro-static discharge circuit through the short circuit ring unit. When static charges are generated on the gate line or on the data line, the static charges on the gate line or on the data line can be released to the charge release signal line through the electro-static discharge unit that is connected with the gate line or the data line; and then the static charges are released to the power signal line quickly through the short circuit ring unit that is adjacent to the gate line or the data line, thus the static charges can be timely released. Compared with the static charges release of the electro-static discharge circuit having a long discharge path, the present embodiment can avoid the problem that the electro-static discharge is not timely, thus the performance of the array substrate is improved.

As shown in FIG. 1a and FIG. 1b, in embodiments of the present disclosure, in the array substrate mentioned above, one short circuit ring unit is provided for two adjacent gate lines and/or two adjacent data lines correspondingly. For example, one short circuit ring unit can be disposed between every two adjacent gate lines and/or every two adjacent data lines. Thus, when static charges are generated on each gate line or each data line, the static charges can be released quickly through the corresponding short circuit ring unit. That is, static charges on each gate line or each data line can be released through the nearest short circuit ring unit, thus the efficiency of electro-static discharge is improved.

Figure 2A:
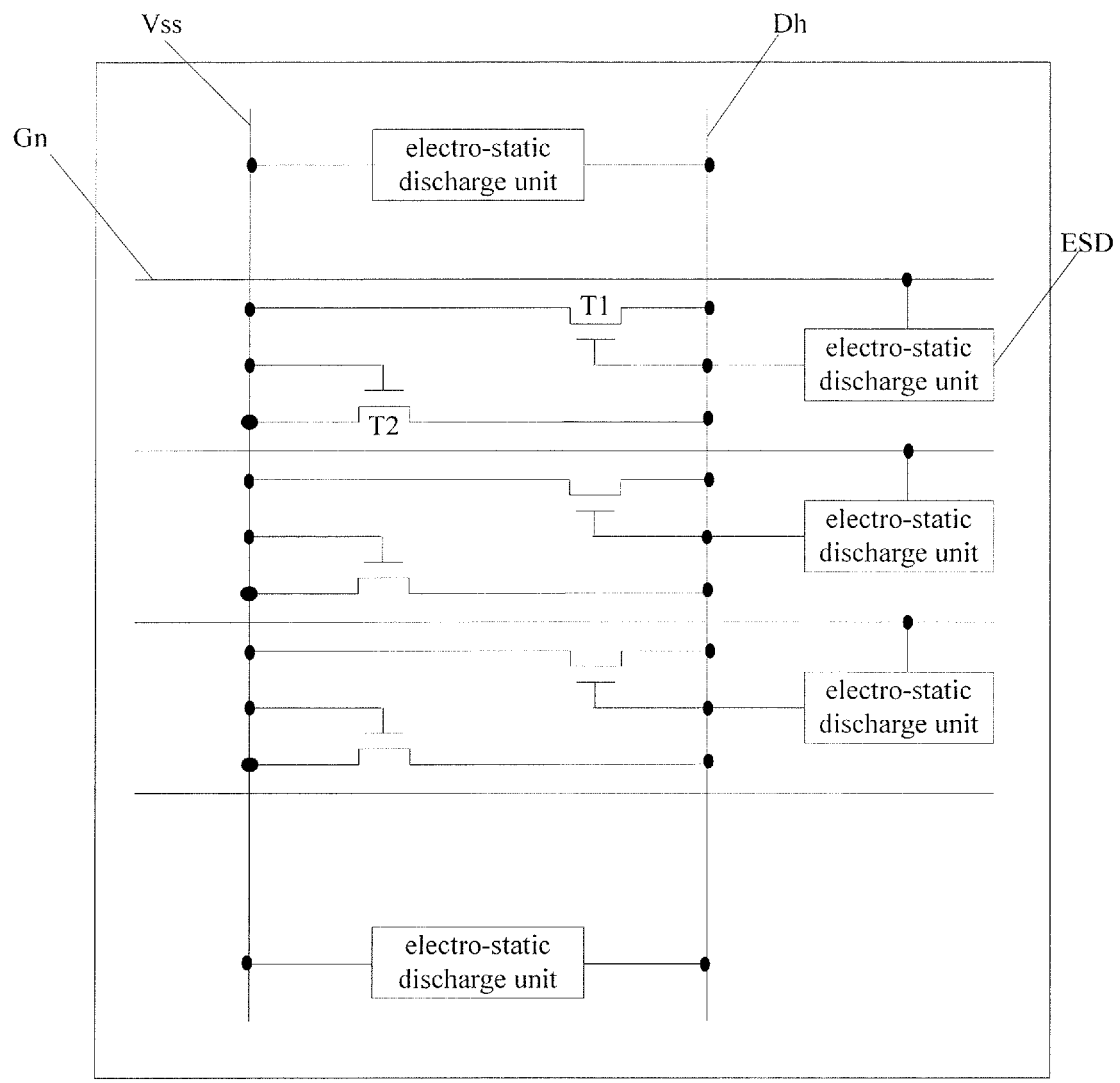
FIG. 2a is a structure schematic view of a short circuit ring unit of an array substrate according to an embodiment of the present disclosure.
Figure 2B:
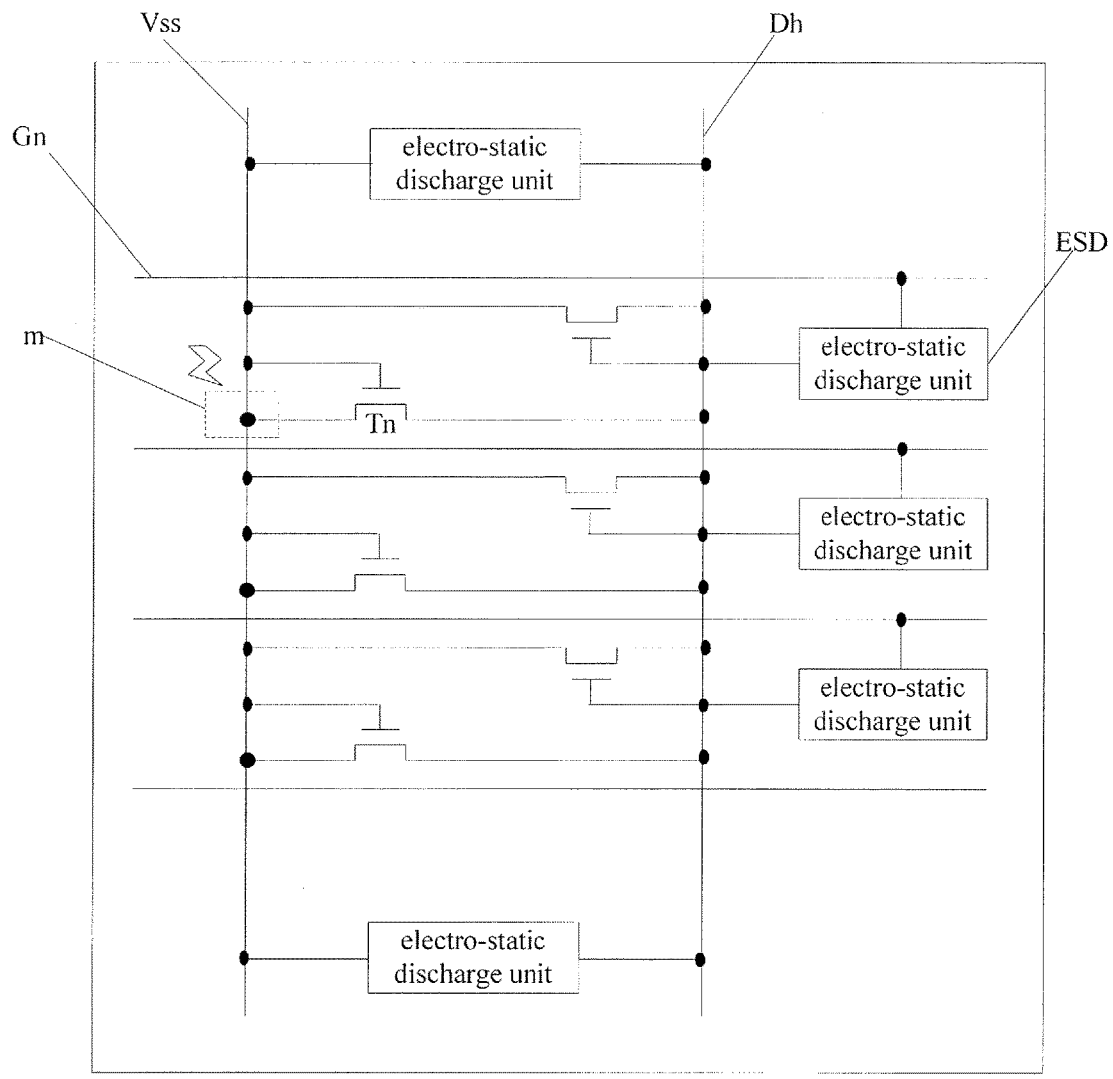
FIG. 2b is a schematic view showing electro-static discharge over a power signal line of an array substrate according to an embodiment of the present disclosure.
Figure 2C:
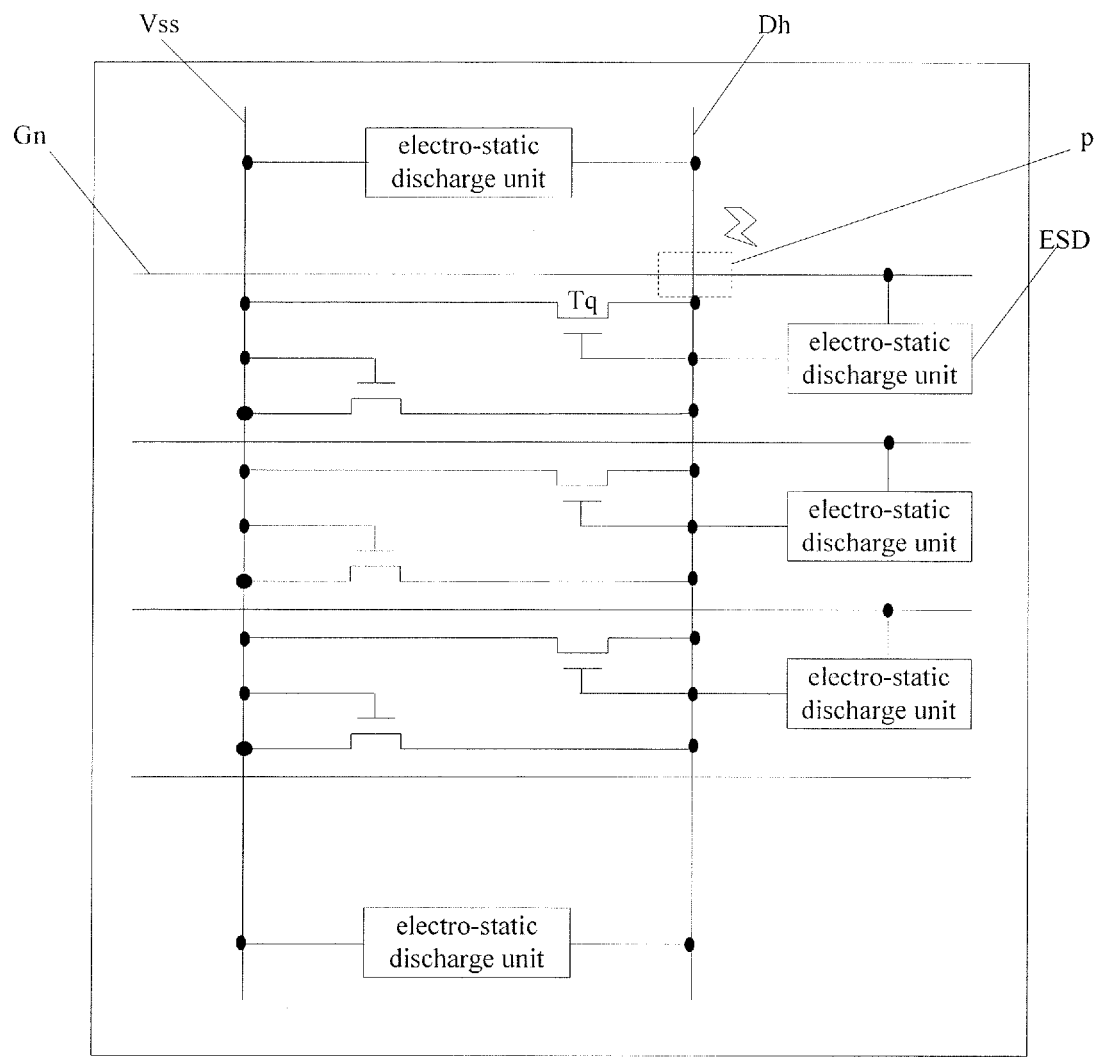
FIG. 2c is a schematic view showing electro-static discharge over a gate line of an array substrate according to an embodiment of the present disclosure.

As shown in FIG. 2a, in embodiments of the present disclosure, an example of the short circuit ring unit of the array substrate mentioned above, for instance, comprises: a first switching transistor T1 and a second switching transistor T2. The gate electrode and the source electrode of the first switching transistor T1 are both connected with the charge release signal line Dh, and the drain electrode thereof is connected with the power signal line Vss; the gate electrode and the source electrode of the second switching transistor T2 are both connected with the power signal line Vss, and the drain electrode thereof is connected with the charge release signal line Dh. The short circuit ring unit mentioned above that comprises the first switching transistor and the second switching transistor can realize the function of quickly releasing of static charges on an adjacent line. For example, as shown in FIG. 2b, when static charges are generated on the power signal line at the location indicated by a dotted line box m, the switching transistor Tn that is nearest to the location indicated by the dotted line box m is turned on. Therefore, the static charges generated at the location can be released to the electro-static discharge circuit quickly through the switching transistor Tn that is turned on. For example, as shown in FIG. 2c, when static charges are generated on the gate line Gn at the location indicated by a dotted line box p, the static charges on the gate line Gn are released to the charge release signal line Dh through the electro-static discharge unit ESD corresponding to the gate line Gn; and the switching transistor Tq of the short circuit ring unit that is nearest to the gate line Gn is turned on. Therefore, the static charges generated at the location can be released to the power signal line Vss quickly through the switching transistor Tq that is turned on. Releasing of the static charges through the nearest short circuit ring unit can avoid the problem that the electro-static discharge is not timely, thus the efficiency of electro-static discharge is improved.

Figure 3A:
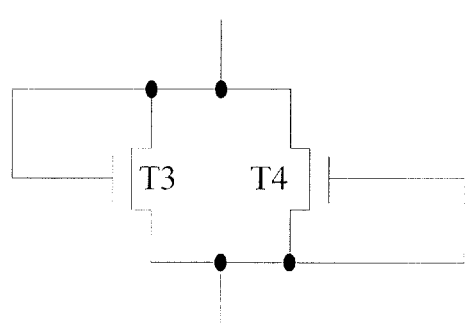
FIG. 3a and FIG. 3b are structure schematic views of electro-static discharge units according to an embodiment of the present disclosure.

As shown in FIG. 3a, in the array substrate mentioned above according to embodiments of the present disclosure, an example of the electro-static discharge unit, for instance, comprises: a third switching transistor T3 and a fourth switching transistor T4. The electro-static discharge unit, the power signal line and the charge release signal line constitute an electro-static discharge circuit in combination. The gate electrode and the source electrode of the third switching transistor T3 are both connected with the power signal line, and the drain electrode thereof is connected with the charge release signal line. The gate electrode and the source electrode of the fourth switching transistor T4 are both connected with the charge release signal line, and the drain electrode thereof is connected with the power signal line. Alternatively, the electro-static discharge unit connects a gate line and the charge release signal line. The gate electrode and the source electrode of the third switching transistor T3 are both connected with the gate line, and the drain electrode thereof is connected with the charge release signal line. The gate electrode and the source electrode of the fourth switching transistor T4 are both connected with the charge release signal line, and the drain electrode thereof is connected with the gate line. Alternatively, the electro-static discharge unit connects a data line and the charge release signal line. The gate electrode and the source electrode of the third switching transistor T3 are both connected with the data line, and the drain electrode thereof is connected with the charge release signal line. The gate electrode and the source electrode of the fourth switching transistor T4 are both connected with the charge release signal line, and the drain electrode thereof is connected with the data line. In the array substrate mentioned above according to embodiments of the present disclosure, the structure comprising the third switching transistor and the fourth switching transistor can realize the function of the electro-static discharge unit. The structure can form an electro-static discharge circuit along with the power signal line and the charge release signal line, and can also release the static charges on the adjacent line, such as a gate line or a data line, to the electro-static discharge circuit quickly. The electro-static discharge units of the embodiment are not limited to be of the same structure.

Figure 3B:
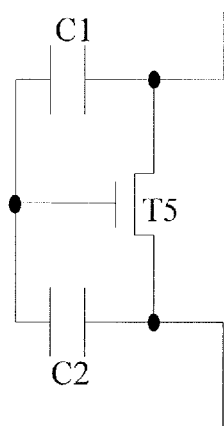

As shown in FIG. 3b, in the array substrate mentioned above according to embodiments of the present disclosure, an example of the electro-static discharge unit, for instance, comprises: a fifth switching transistor T5, a first capacitor C1 and a second capacitor C2. The electro-static discharge unit, the power signal line and the charge release signal line constitute an electro-static discharge circuit. The gate electrode of the fifth switching transistor T5 is connected with one end of the first capacitor C1 and one end of the second capacitor C2 respectively; the source electrode thereof is connected with the other end of the first capacitor C1 and the power signal line respectively; and the drain electrode thereof is connected with the other end of the second capacitor C2 and the charge release signal line respectively. Alternatively, the electro-static discharge unit connects a gate line and the charge release signal line. The gate electrode of the fifth switching transistor T5 are connected with one end of the first capacitor C1 and one end of the second capacitor C2 respectively; the source electrode thereof is connected with the other end of the first capacitor C1 and the gate line; and the drain electrode thereof is connected with the other end of the second capacitor C2 and the charge release signal line. Alternatively, the electro-static discharge unit connects the data line and the charge release signal line. The gate electrode of the fifth switching transistor T5 connects with one end of the first capacitor C1 and one end of the second capacitor C2 respectively; the source electrode thereof is connected with the other end of the first capacitor C1 and the data line respectively; and the drain electrode thereof is connected with the other end of the second capacitor C2 and the charge release signal line respectively. In the array substrate mentioned above according to embodiments of the present disclosure, the structure comprising the fifth switching transistor the first capacitor and the second capacitor can realize the function of the electro-static discharge unit. The structure can form the electro-static discharge circuit along with the power signal line and the charge release signal line, and the static charges on an adjacent line, such as a gate line or a data line, can be released to the electro-static discharge circuit quickly. The electro-static discharge units of the embodiment are not limited to be of the same structure.

It should be noted that, the switching transistor mentioned in the embodiments above can be a thin film transistor (TFT), or can be a metal oxide semiconductor (MOS), the type of which is not limited herein. In some embodiments, the source electrode and the drain electrode of the transistor can be exchanged, which is not distinguished in structure. Only two exemplary the circuit structures of the electro-static discharge unit according to embodiments of the present disclosure are described. In some embodiments of the present disclosure, the electro-static discharge unit can be realized in other circuit structures which can realize the function of the electro-static discharge unit, which is not limited herein.

The array substrate according to embodiments of the present disclosure further comprises: an organic electroluminescent structure. The power signal line and the cathode of the organic electroluminescent structure are connected. In the array substrate according to embodiments of the present disclosure, static charges are easily generated in the deposition process of the cathode of the organic electroluminescent structure. The cathode and the power signal line are connected, thus the static charges on the cathode can be released to the electro-static discharge circuit quickly; the static charges On other lines can be released to the electro-static discharge circuit through the short circuit ring unit, and finally released to the cathode. Because the static charges are released quickly, the problem that the electro-static discharge is not timely can be avoided.

An electro-static discharge method of the array substrate mentioned above according to embodiments of the present disclosure comprises the following steps: upon static charges being generated on the power signal line, releasing the static charges to the electro-static discharge circuit through the short circuit ring unit; upon static charges being generated on a gate line or a data line, releasing the static charges to the charge release signal line through the electro-static discharge unit connected with the gate line or the data line, and releasing the static charges to the power signal line through the short circuit ring unit adjacent to the gate line or the data line.

In some embodiments of the present disclosure, when lot of static charges are generated on the power signal line, the static charges on the power signal line are released to the electro-static discharge circuit through the short circuit ring unit. When static charges are generated on a gate line or on a data line, the static charges on the gate line or on the data line are released to the charge release signal line through the electro-static discharge unit that is connected with the gate line or the data line; and then the static charges are released to the power signal line quickly through the short circuit ring unit that is adjacent to it, finally the static charges are timely released. Compared with the static charges release of the electro-static discharge circuit having a long discharge path, the present embodiment can avoid the problem that the electro-static discharge is not timely, thus the performance of the array substrate is improved.

An organic electroluminescent display panel according to an embodiment of the present disclosure comprises the array substrate mentioned above according to embodiments of the present disclosure. Because the principle to solve the problem of electro-static discharge of the organic electroluminescent display panel is similar to that of the array substrate, the examples of the array substrate can be referred to implement the organic electroluminescent display panel, which is not repeated herein.

A display device according to an embodiment of the present disclosure comprises the organic electroluminescent display panel mentioned above according to embodiments of the present disclosure. The display device can be any product or component having a display function such as mobile phone, tablet computer, television, display screen, laptop computer, digital photo frame, navigator or the like. Because the principle to solve the problem of electro-static discharge of the display device is similar to that of the organic electroluminescent display panel, the examples of the organic electroluminescent display panel can be referred to implement the display device, which is not repeated herein.

What are described above is related to the illustrative embodiments of the disclosure only and not limitative to the scope of the disclosure. Therefore, the scopes of the disclosure are defined by the accompanying claims.

The present application claims the priority of the Chinese Patent Application No. 201510673778.3 filed on Oct. 16, 2015, which is incorporated herein in its entirety by reference as part of the disclosure of the present application.

What is claimed is:

1. An array substrate, comprising: a plurality of data lines, a plurality of gate lines, a power signal line, a charge release signal line, a plurality of electro-static discharge units and at least one short circuit ring unit, wherein, the charge release signal line and the power signal line are disposed in parallel, two of the electro-static discharge units are disposed between the charge release signal line and the power signal line to form an electro-static discharge circuit, each of the gate lines and/or each of the data lines is connected with the charge release signal line by one of the electro-static discharge units;

a first control terminal and a first input terminal of the short circuit ring unit are connected with the charge release signal line, a first output terminal is connected with the power signal line, a second control terminal and a second input terminal are connected with the power signal line, and a second output terminal is connected with the charge release signal line.

2. The array substrate according to claim 1, wherein, two adjacent gate lines of the gate lines and/or two adjacent data lines of the data lines correspond to one short circuit ring unit.

3. The array substrate according to claim 2, wherein, the short circuit ring unit comprises: a first switching transistor and a second switching transistor, a gate electrode and a source electrode of the first switching transistor are both connected with the charge release signal line, a drain electrode of the first switching transistor is connected with the power signal line; and a gate electrode and a source electrode of the second switching transistor are both connected with the power signal line, a drain electrode of the second switching transistor is connected with the charge release signal line.

4. The array substrate according to claim 1, wherein, at least one of the electro-static discharge units comprises: a third switching transistor and a fourth switching transistor, the electro-static discharge unit, the power signal line and the charge release signal line form an electro-static discharge circuit, a gate electrode and a source electrode of the third switching transistor are both connected with the power signal line, and a drain electrode of the third switching transistor is connected with the charge release signal line; a gate electrode and a source electrode of the fourth switching transistor are both connected with the charge release signal line, and a drain electrode of the fourth switching transistor is connected with the power signal line; or the electro-static discharge unit connects the gate line and the charge release signal line, the gate electrode and the source electrode of the third switching transistor are both connected with the gate line, and the drain electrode of the third switching transistor is connected with the charge release signal line; the gate electrode and the source electrode of the fourth switching transistor are both connected with the charge release signal line, and the drain electrode of the fourth switching transistor is connected with the gate line; or the electro-static discharge unit connects the data line and the charge release signal line, the gate electrode and the source electrode of the third switching transistor are both connected with the data line, and the drain electrode of the third switching transistor is connected with the charge release signal line; the gate electrode and the source electrode of the fourth switching transistor are both connected with the charge release signal line, and the drain electrode of the fourth switching transistor is connected with the data line.

5. The array substrate according to claim 1, wherein, at least one of the electro-static discharge units comprises: a fifth switching transistor, a first capacitor and a second capacitor, the electro-static discharge unit, the power signal line and the charge release signal line form an electro-static discharge circuit, a gate electrode of the fifth switching transistor connects with one end of the first capacitor and one end of the second capacitor respectively, a source electrode of the fifth switching transistor connects with the other end of the first capacitor and the power signal line respectively, a drain electrode of the fifth switching transistor connects with the other end of the second capacitor and the charge release signal line respectively; or the electro-static discharge unit connects the gate line and the charge release signal line, the gate electrode of the fifth switching transistor connects with one end of the first capacitor and one end of the second capacitor respectively, the source electrode of the fifth switching transistor connects with the other end of the first capacitor and the gate line, and the drain electrode of the fifth switching transistor connects with the other end of the second capacitor and the charge release signal line; or the electro-static discharge unit connects the data line and the charge release signal line, the gate electrode of the fifth switching transistor connects with one end of the first capacitor and one end of the second capacitor respectively, the source electrode of the fifth switching transistor connects with the other end of the first capacitor and the data line respectively, and the drain electrode of the fifth switching transistor connects with the other end of the second capacitor and the charge release signal line respectively.

6. The array substrate according to claim 1, further comprising an organic electroluminescent structure comprising a cathode; wherein, the power signal line and the cathode of the organic electroluminescent structure are connected.

7. An electro-static discharge method of the array substrate according to claim 1 comprising:

upon static charges being generated on the power signal line, releasing the static charges to the electro-static discharge circuit through the short circuit ring unit; and upon static charges being generated on the gate line or the data line, releasing the static charges to the charge release signal line through the electro-static discharge unit connected with the gate line or the data line, and releasing the static charges to the power signal line through the short circuit ring unit adjacent to the gate line or the data line.

8. An organic electroluminescent display panel, comprising the array substrate according to claim 1.

9. A display device, comprising the organic electroluminescent display panel according to claim 8.

\* \* \* \* \*